United States Patent
Takahata et al.

(10) Patent No.: US 11,806,901 B2
(45) Date of Patent: Nov. 7, 2023

(54) TEMPLATE, TEMPLATE MANUFACTURING METHOD, AND SEMICONDUCTOR DEVICE MANUFACTURING METHOD

(71) Applicant: Kioxia Corporation, Tokyo (JP)

(72) Inventors: Kazuhiro Takahata, Yokohama Kanagawa (JP); Toshiaki Komukai, Kawasaki Kanagawa (JP); Hideki Kanai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 251 days.

(21) Appl. No.: 17/199,967

(22) Filed: Mar. 12, 2021

(65) Prior Publication Data

US 2022/0080627 A1    Mar. 17, 2022

(30) Foreign Application Priority Data

Sep. 17, 2020 (JP) ................... 2020-156421

(51) Int. Cl.
| | | |
|---|---|---|
| *H01L 21/768* | (2006.01) | |
| *H01L 21/56* | (2006.01) | |
| *B29C 33/42* | (2006.01) | |
| *G03F 7/00* | (2006.01) | |

(52) U.S. Cl.
CPC ............. *B29C 33/42* (2013.01); *H01L 21/565* (2013.01)

(58) Field of Classification Search
CPC ............... H01L 21/76807; H01L 21/48; H01L 21/76817; H01L 21/565; H01L 23/5384; H01L 2221/1021
See application file for complete search history.

(56) References Cited

U.S. PATENT DOCUMENTS

| | | | |
|---|---|---|---|
| 7,709,373 B1* | 5/2010 | Dakshina-Murthy | ......................... B82Y 10/00 438/597 |
| 8,466,068 B2 | 6/2013 | Scheuerlein | |
| 8,808,557 B1* | 8/2014 | Seino | ................... G03F 7/0002 216/41 |
| 9,865,473 B1* | 1/2018 | Ogino | ................. H01L 21/0337 |
| 11,061,324 B2* | 7/2021 | Tanabe | ................ H01L 21/3086 |
| 2009/0166682 A1 | 7/2009 | Scheuerlein | |
| 2010/0301449 A1* | 12/2010 | Scheuerlein | ........ H01L 27/0688 257/E27.009 |

(Continued)

FOREIGN PATENT DOCUMENTS

JP    2011-508459 A    3/2011

*Primary Examiner* — Mohsen Ahmadi

(74) *Attorney, Agent, or Firm* — Finnegan, Henderson, Farabow, Garrett & Dunner, LLP

(57) ABSTRACT

According to one embodiment, a template is provided with a transferring pattern on a first surface of a substrate. The transferring pattern includes a first projecting portion that projects from the first surface with a first height and extends in a first direction along the first surface, a second projecting portion that projects from the first surface with a second height higher than the first height and extends in a second direction along the first surface, a first columnar portion that is arranged at a position overlapping with the first projecting portion and has a top surface with a third height higher than the second height as a height from the first surface, and a second columnar portion that is arranged at a position overlapping with the second projecting portion and has a top surface with the third height as a height from the first surface.

10 Claims, 12 Drawing Sheets

(56) References Cited

U.S. PATENT DOCUMENTS

| | | | |
|---|---|---|---|
| 2011/0062623 A1* | 3/2011 | Saito | G03F 7/0002 |
| | | | 264/219 |
| 2012/0028378 A1* | 2/2012 | Morinaga | G03F 7/0002 |
| | | | 257/E21.529 |
| 2012/0072003 A1* | 3/2012 | Matsuoka | G03F 7/0002 |
| | | | 700/110 |
| 2013/0264675 A1* | 10/2013 | Scheuerlein | H01L 27/101 |
| | | | 257/499 |
| 2014/0057436 A1* | 2/2014 | Chen | H01L 21/76816 |
| | | | 257/E21.586 |
| 2017/0168388 A1* | 6/2017 | Akiyama | H10K 71/611 |
| 2019/0157106 A1* | 5/2019 | Joseph | H01L 21/32136 |
| 2021/0035815 A1* | 2/2021 | Das | H01L 21/32139 |
| 2021/0096461 A1* | 4/2021 | Kumada | H01L 21/027 |
| 2022/0085285 A1* | 3/2022 | Dieny | H10N 50/01 |

* cited by examiner

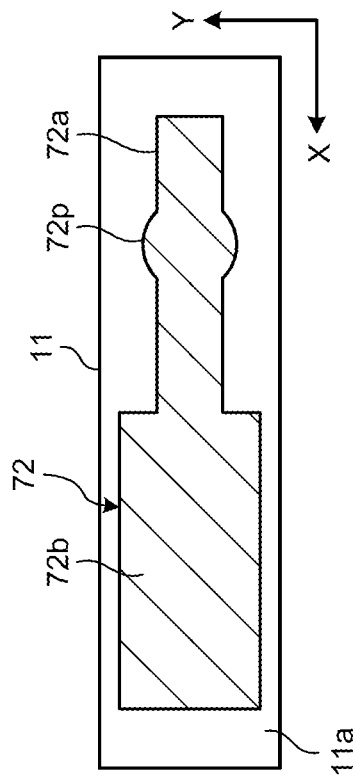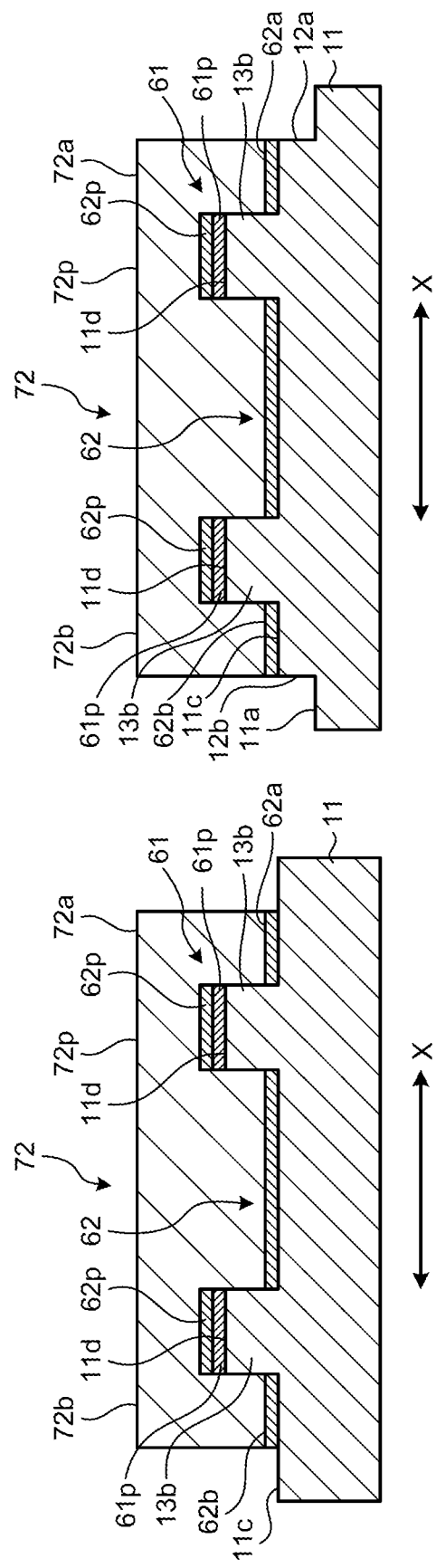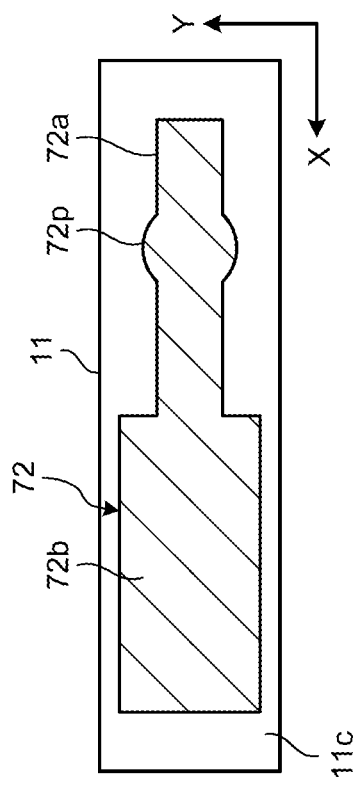

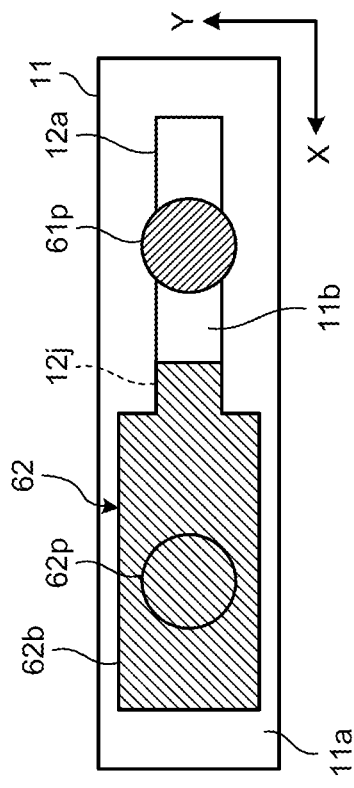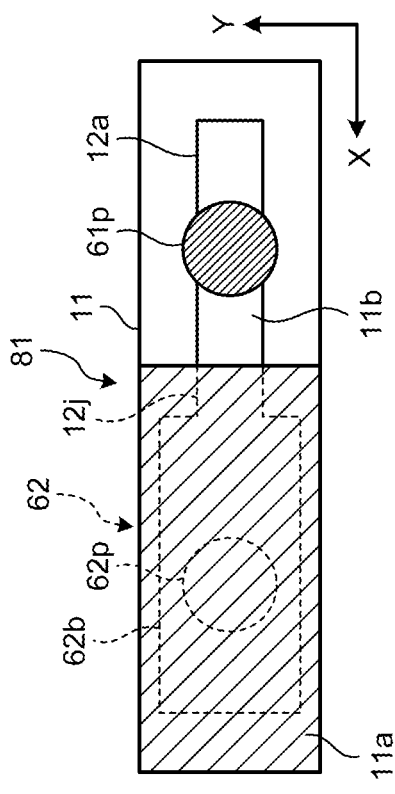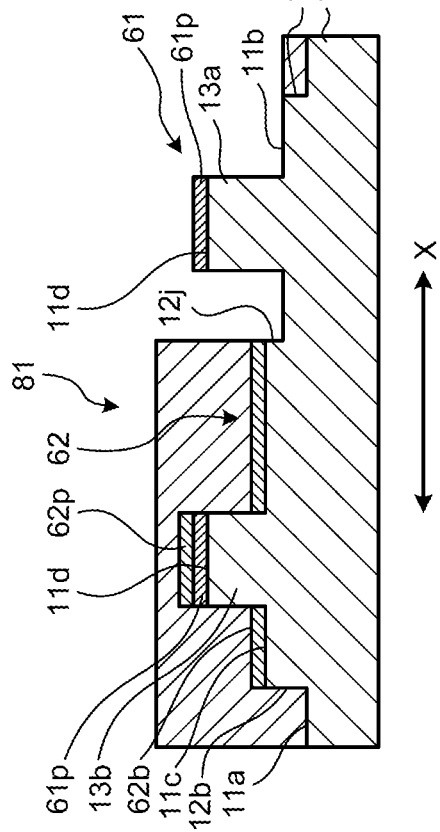

US 11,806,901 B2

TEMPLATE, TEMPLATE MANUFACTURING METHOD, AND SEMICONDUCTOR DEVICE MANUFACTURING METHOD

CROSS-REFERENCE TO RELATED APPLICATIONS

This application is based upon and claims the benefit of priority from Japanese Patent Application No. 2020-156421, filed on Sep. 17, 2020; the entire contents of which are incorporated herein by reference.

FIELD

An embodiment of the present invention described herein relates generally to a template, a template manufacturing method, and a semiconductor device manufacturing method.

BACKGROUND

In a process of manufacturing a semiconductor device, there is a case where a dual damascene method is used that collectively forms vias to be connected to a lower layer structure and upper layer interconnection lines to be connected to the vias.

Further, in the formation of vias and upper layer interconnection lines by the dual damascene method, there is a case where the technique of an imprint method is used. In the imprint method, a resist is formed on a processing object film, and a template with a pattern formed thereon is pressed against the resist to transfer the pattern of the template onto the resist.

With the miniaturization of semiconductor devices, more complicated requirements have arisen, regarding the via size and the upper layer interconnection line size, which can be formed by the imprint technique.

BRIEF DESCRIPTION OF THE DRAWINGS

FIGS. 6Aa to 6Bb are diagrams illustrating an example of procedures in the manufacturing method of the template according to the embodiment;

FIGS. 9Aa to 9Bb are diagrams illustrating an example of procedures in the manufacturing method of the template according to the embodiment;

DETAILED DESCRIPTION

In general, according to one embodiment, a template is provided with a transferring pattern on a first surface of a substrate. The transferring pattern includes a first projecting portion that projects from the first surface with a first height and extends in a first direction along the first surface, a second projecting portion that projects from the first surface with a second height higher than the first height and extends in a second direction along the first surface, a first columnar portion that is arranged at a position overlapping with the first projecting portion and has a top surface with a third height higher than the second height as a height from the first surface, and a second columnar portion that is arranged at a position overlapping with the second projecting portion and has a top surface with the third height as a height from the first surface.

Hereinafter, the present invention will be explained below in detail with reference to the accompanying drawings. The present invention is not limited to the following embodiment. The constituent elements in the following embodiment encompass those which can be easily assumed by a person skilled in the art, or which are substantially equivalent thereto.

(Outline of Dual Damascene by Imprint Method)

FIGS. 1A to 1D are schematic diagrams illustrating the outline of a formation flow for interconnection lines and vias by a dual damascene method using an imprint technique according to an embodiment. It should be noted that each of the figures illustrated in FIGS. 1A to 1D is a simplified view, and does not necessarily accurately represent each configuration.

Figure 1A:
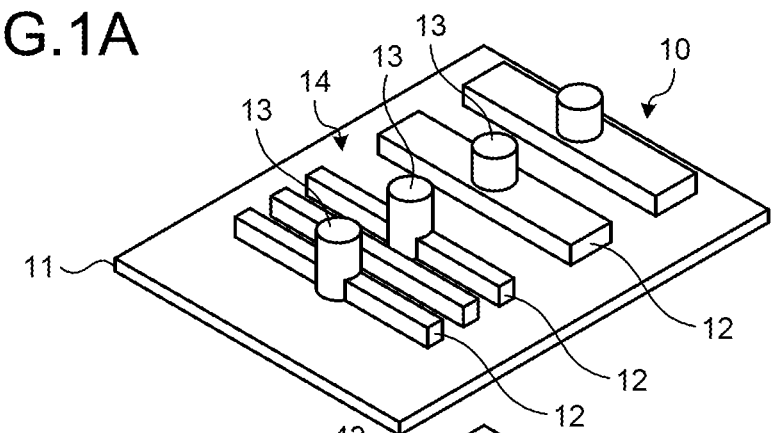
FIGS. 1A to 1D are schematic diagrams illustrating the outline of a formation flow for interconnection lines and vias by a dual damascene method using an imprint technique according to an embodiment.

As illustrated in FIG. 1A, a template 10 is provided with a transferring pattern 14 that includes projecting portions 12 and columnar portions 13 arranged on a substrate 11 made of quartz or the like. The columnar portions 13 are arranged at positions overlapping with the projecting portions 12.

Figure 1B:
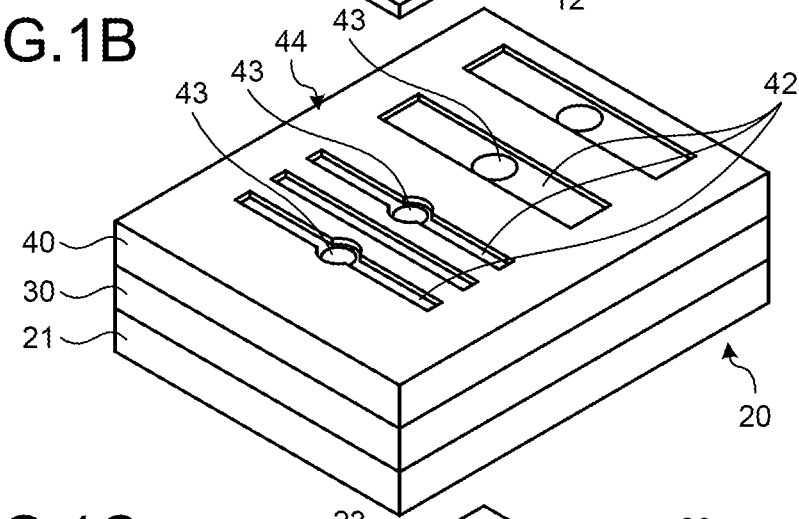

As illustrated in FIG. 1B, a semiconductor device 20 in the manufacturing process is provided with a processing object film 21 made of $SiO_2$ or the like to which the transferring pattern 14 of the template 10 is to be transferred. A carbon (SOC: Spin On Carbon) film 30 as a carbon-containing film has been formed on the processing object film 21. A resist film 40 has been formed on the carbon film 30.

The transferring pattern 14 of the template 10 is pressed against the resist film 40. Consequently, a pattern 44 is formed on the resist film 40, such that the pattern 44 includes trenches 42 and further includes holes 43 arranged at positions overlapping with the respective trenches 42. Then, the carbon film 30 is processed in accordance with the pattern 44 of the resist film 40, and the pattern 44 of the resist film 40 is thereby transferred onto the carbon film 30. Furthermore, the processing object film 21 of the semiconductor device 20 is processed in accordance with the pattern (not illustrated) of the carbon film 30.

Figure 1C:
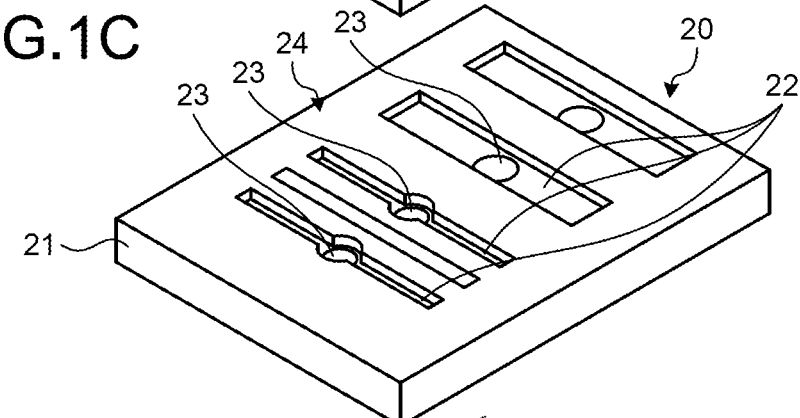

As illustrated in FIG. 1C, as the pattern 44 of the resist film 40 is transferred through the carbon film 30, a pattern 24 is formed on the processing object film 21, such that the pattern 24 includes trenches 22 and further includes holes 23 arranged at positions overlapping with the respective trenches 22.

Figure 1D:
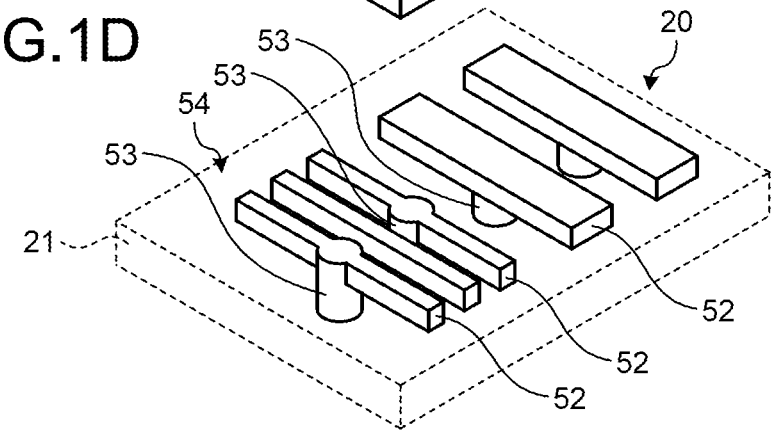

As illustrated in FIG. 1D, a conductive material is filled into the pattern 24 of the processing object film 21. Consequently, a dual damascene pattern 54 is formed on the processing object film 21, such that the pattern 54 includes interconnection lines 52 in which the trenches 22 are filled with the conductive material, and further includes vias 53 in which the holes 23 are filled with the conductive material.

(Configuration Example of Template)

Next, with reference to FIGS. 2A to 2C, an explanation will be given of a detailed configuration example of the template 10 according to the embodiment.

Figure 2A:
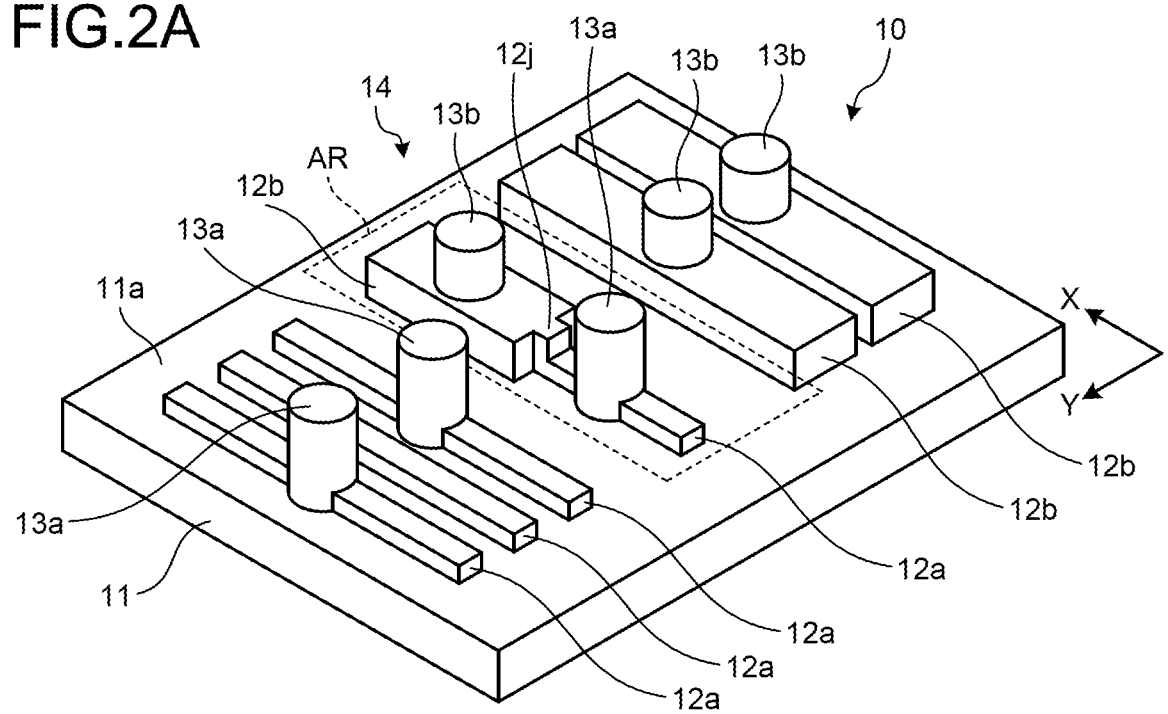
FIGS. 2A to 2C are diagrams illustrating an example of the configuration of a template according to the embodiment.
Figure 2B:
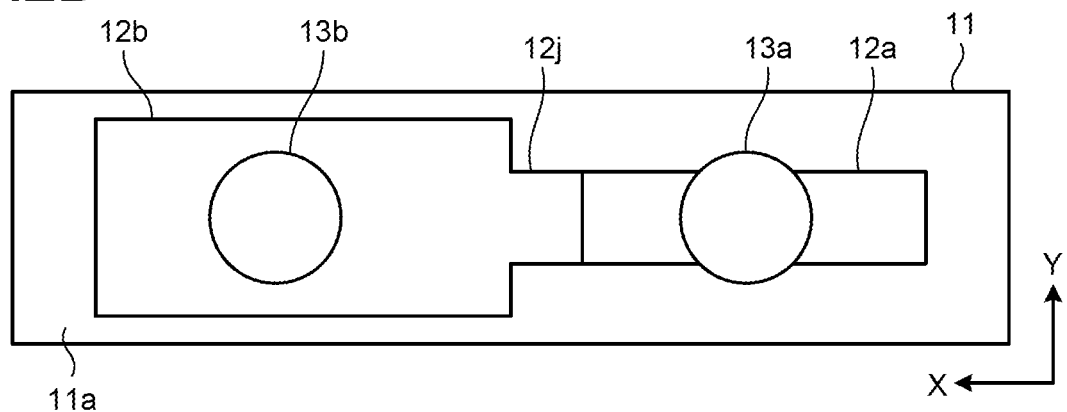
Figure 2C:
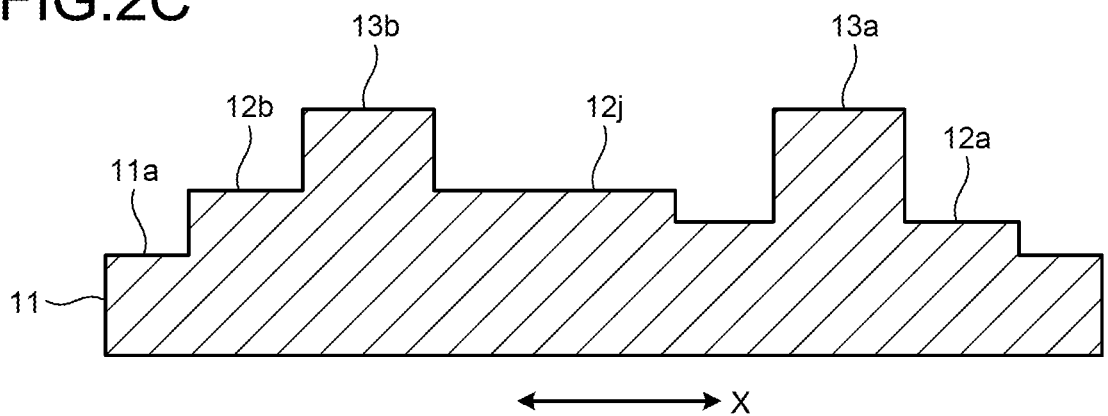

FIGS. 2A to 2C are diagrams illustrating an example of the configuration of the template 10 according to the embodiment. FIG. 2A is a perspective view illustrating the overall configuration of the template 10, FIG. 2B is a plan view of a region AR of the template 10, and FIG. 2C is a sectional view of the region AR of the template 10.

Further, in FIGS. 2A to 2C, for the convenience of explanation, an X-direction and a Y-direction are defined. The X-direction is along a surface 11a that is a first surface and is one of the main faces of the template 10, and the i-direction is orthogonal to the X-direction and along the surface 11a of the template 10.

As illustrated in FIGS. 2A to 2C, the template 10 includes a substrate 11 having a flat plate shape and made of a transparent material, such as glass or quartz. The substrate 11 includes two main faces, and one of which is the surface 11a and is provided with the transferring pattern 14.

The transferring pattern 14 includes a plurality of projecting portions 12a and 12b and a plurality of columnar portions 13a and 13b.

The projecting portions 12a as a plurality of first projecting portions are arrayed in the Y-direction and extend in a direction defined as a first direction along the X-direction. Each of the projecting portions 12a has a substantially flat top surface and lateral surfaces arranged on both sides in the Y-direction of the top surface. Here, some of the plurality of projecting portions 12a may extend in a direction other than the X-direction, such as the Y-direction.

The projecting portions 12b as a plurality of second projecting portions are arrayed in the Y-direction and extend in a direction defined as a second direction along the X-direction. Each of the projecting portions 12b has a substantially flat top surface and lateral surfaces arranged on both sides in the Y-direction of the top surface. The top surface height of each projecting portion 12b as a second height from the surface 11a of the substrate 11 is higher than the top surface height of each projecting portion 12a as a first height from the surface 11a of the substrate 11. Further, the width in the Y-direction of each projecting portion 12b as a second width is wider than the width in the Y-direction of each projecting portion 12a as a first width. Here, the extending direction of the plurality of projecting portions 12b may be substantially the same as the extending direction of the projecting portions 12a. Further, some of the plurality of projecting portions 12b may extend in a direction other than the X-direction, such as the Y-direction.

Further, as in the projecting portions 12a and 12b arranged in the region AR, some of the projecting portions 12b may be connected to some of the projecting portions 12a. In this case, a projecting portion 12a and a projecting portion 12b are connected to each other through a connecting portion 12j.

The top surface height of the connecting portion 12j from the surface 11a of the substrate 11 is substantially equal to the top surface height of each projecting portion 12b from the surface 11a of the substrate 11. The width in the Y-direction of the connecting portion 12j is substantially equal to the width in the Y-direction of each projecting portion 12a. However, the connecting portion 12j may be configured such that the top surface height of the connecting portion 12j from the surface 11a of the substrate 11 is substantially equal to the top surface height of each projecting portion 12a from the surface 11a of the substrate 11, and the width in the Y-direction of the connecting portion 12j is substantially equal to the width in the Y-direction of each projecting portion 12b.

The columnar portions 13a as a plurality of first columnar portions are arranged at positions overlapping with the respective projecting portions 12a. Each of the columnar portions 13a has a substantially flat top surface higher than the top surfaces of the projecting portions 12a and 12b. The cross section of each columnar portion 13a orthogonal to the height direction is circular, elliptical, or oval, for example. The width (diameter) in the Y-direction of each columnar portion 13a is larger than the width in the Y-direction of each projecting portion 12a and smaller than the width in the Y-direction of each projecting portion 12b. Therefore, the base of each columnar portion 13a is arranged sticking out from the width in the Y-direction of the associated projecting portion 12a to divide this projecting portion 12a.

The columnar portions 13b as a plurality of second columnar portions are arranged at positions overlapping with the respective projecting portions 12b. Each of the columnar portions 13b has a substantially flat top surface higher than the top surfaces of the projecting portions 12a and 12b. The top surface height of each columnar portion 13b as a third height from the surface 11a of the substrate 11 is substantially equal to the top surface height of each columnar portion 13a as the third height from the surface 11a of the substrate 11. The cross section of each columnar portion 13b orthogonal to the height direction has a shape the same as that of the cross section of each columnar portion 13a. The width (diameter) in the Y-direction of each columnar portion 13b is substantially equal to the width (diameter) in the Y-direction of each columnar portion 13a. The area of the cross section of each columnar portion 13b orthogonal to the height direction is substantially equal to the area of the cross section of each columnar portion 13a. Therefore, each columnar portion 13b is arranged falling within the width in the Y-direction of the top surface of the associated projecting portion 12b.

Here, as an example of the configuration described above, the top surface height of each projecting portion 12a from the surface 11a of the substrate 11 is 20 nm, for example, and the top surface height of each projecting portion 12b from the surface 11a of the substrate 11 is 40 nm, for example. Further, the top surface height of each columnar portion 13a from the top surface of the associated projecting portion 12a is 70 nm, for example, and the top surface height of each columnar portion 13b from the top surface of the associated projecting portion 12b is 50 nm, for example. Therefore, the top surface height of each columnar portion 13a from the surface 11a of the substrate 11 and the top surface height of each columnar portion 13b from the surface 11a of the substrate 11 are both 90 nm.

It should be noted that the transferring pattern 14 of the template 10 described above is a mere example, and the transferring pattern 14 may be arranged with various designs in accordance with a desired dual damascene pattern 54 to be formed on the semiconductor device 20. For example, the number and combination of the projecting portions 12a and the columnar portions 13a on the template 10 are arbitrary, and a plurality of columnar portions 13a may be arranged for one projecting portion 12a. Further, for example, the number and combination of the projecting portions 12b and the columnar portions 13b on the template 10 are arbitrary, and a plurality of columnar portions 13b may be arranged for one projecting portions 12b.

(Manufacturing Method of Template)

Next, with reference to FIGS. 3Aa to 9Bb, an explanation will be given of a manufacturing method of the template 10 according to the embodiment. A manufacturing method of the template 10 according to the embodiment is also a pattern forming method of forming the transferring pattern 14 on the substrate 11 of the template 10.

Figure 3A:
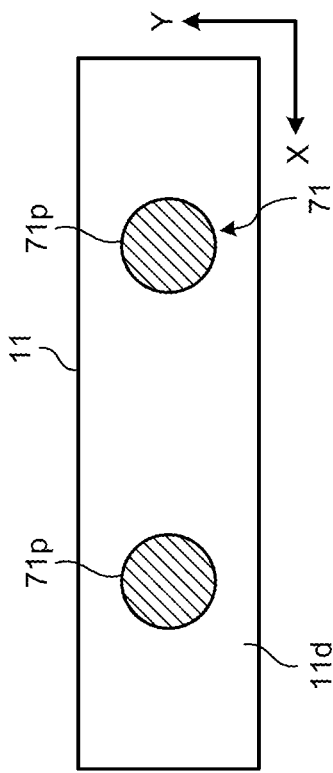
FIGS. 3Aa to 3Bb are diagrams illustrating an example of procedures in a manufacturing method of the template according to the embodiment.

FIGS. 3Aa to 9Bb are diagrams illustrating an example of procedures in a manufacturing method of the template 10 according to the embodiment. The symbols "A" and "B" in the drawing numbers of FIGS. 3Aa to 9Bb indicate that the processing progresses sequentially in this order. Each figure with a drawing number including "a" attached to "A" or "B" of FIGS. 3Aa to 9Bb is a plan view illustrating the region AR of the template 10 in the associated processing step. Each figure with a drawing number including "b" attached to "A" or "B" of FIGS. 3Aa to 9Bb is a sectional view illustrating the region AR of the template 10 in the associated processing step.

In this way, FIGS. 3Aa to 9Bb illustrate the procedures with which the projecting portions 12a and 12b and the columnar portions 13a and 13b are formed in the region AR of the template 10. Further, also in the other regions of the template 10, the projecting portions 12a and 12b and the columnar portions 13a and 13b are formed with these procedures in substantially the same manner as in the region AR.

As illustrated in FIGS. 3Aa and 3Ab, a hard mask film 61 made of Cr or the like is formed on a surface 11d that is a first surface of the substrate 11 made of glass, quartz, or the like. A resist film 71 for Electron Beam (EB) drawing is formed on the hard mask film 61. The surface 11d of the substrate 11 is one of the two main faces of the substrate 11 before the start of processing for the template 10, and is the target surface to form the transferring pattern 14 thereon. The surface 11d may have been prepared as a machined surface, rolled surface, or the like, depending on the method of processing the substrate 11 into a flat plate shape. The surface 11d of the substrate 11 is also called an initial state surface before the start of processing for the template 10.

For example, patterns 71p are formed on the resist film 71 by EB drawing. The patterns 71p are patterns for forming the columnar portions 13a and 13b on the substrate 11, and are the same in shape and the same in diameter as the columnar portions 13a and 13b when seen in the top view.

Figure 3B:
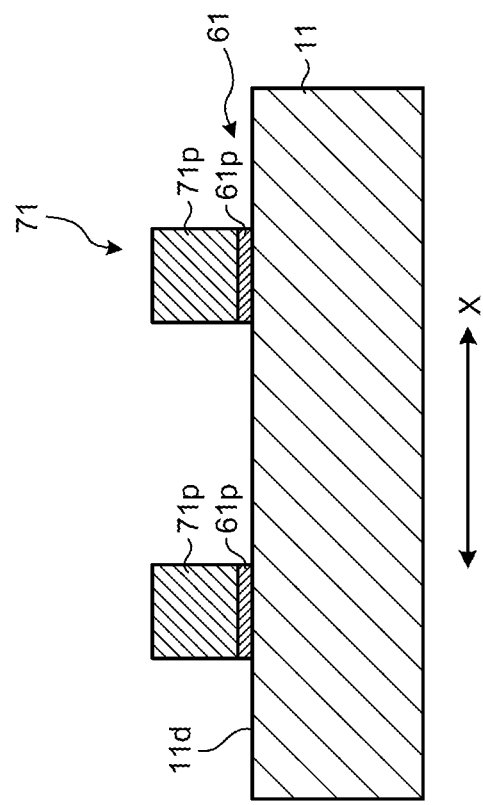
Figure 3A:
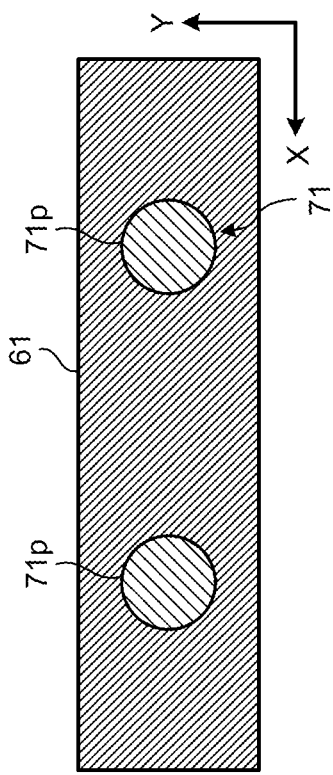
Figure 3B:
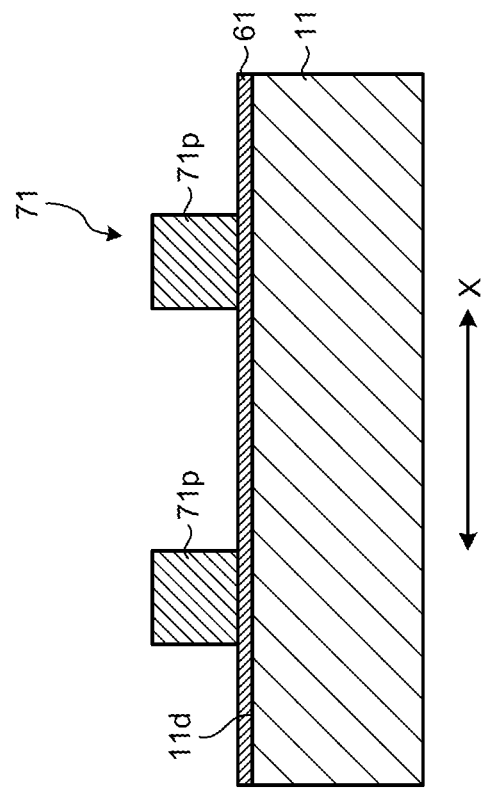

As illustrated in FIGS. 3Ba and 3Bb, the patterns 71p of the resist film 71 are transferred onto the hard mask film 61, and patterns 61p are thereby formed.

Figure 4B:
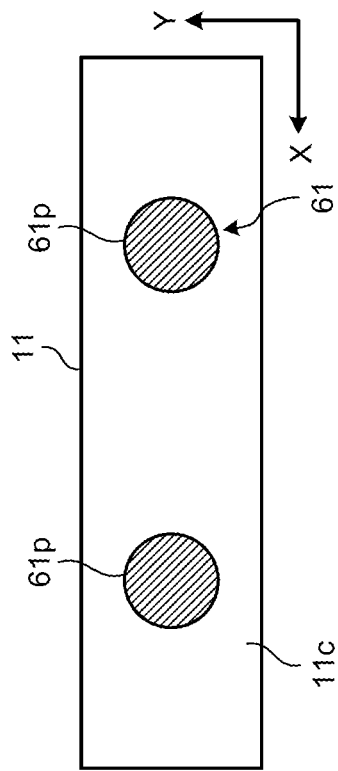
FIGS. 4Aa to 4Bb are diagrams illustrating an example of procedures in the manufacturing method of the template according to the embodiment.
Figure 4B:
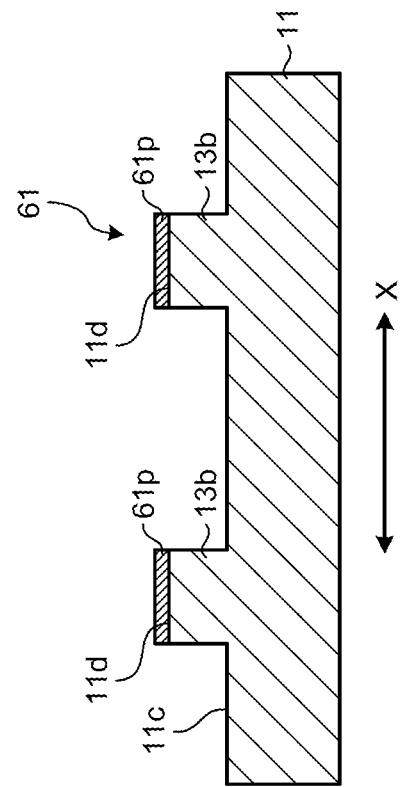
Figure 4A:
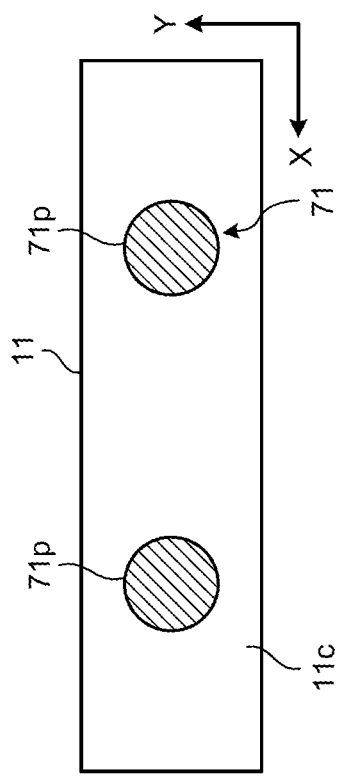
Figure 4A:
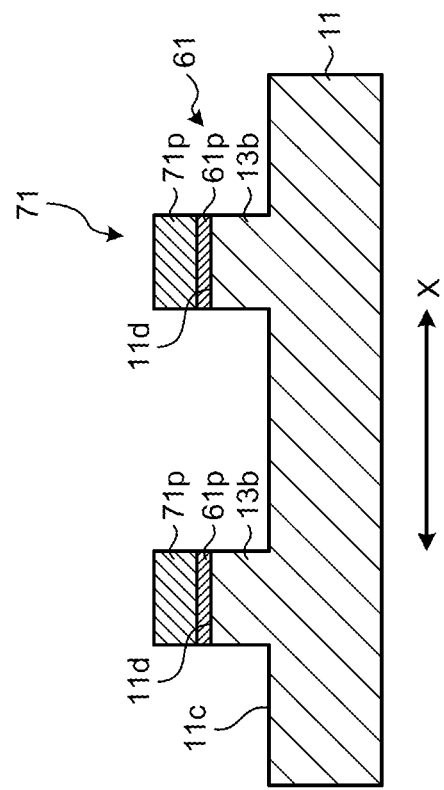

As illustrated FIGS. 4Aa and 4Ab, while being partially protected by the resist film 71 and the hard mask film 61, the surface 11d of the substrate 11 is removed to a predetermined depth in the thickness direction of the substrate 11, and a surface 11c is thereby exposed as a second surface of the substrate 11. Since the surface 11d of the substrate 11 is removed to a predetermined depth, the substrate 11 becomes thinner than the unprocessed substrate 11, and the surface 11c becomes a new main face of the substrate 11.

Further, at this time, a plurality of columnar portions 13b are formed each having a top surface derived from the surface 11d of the initial state substrate 11. However, some of these columnar portions 13b are portions to be further processed later and become the columnar portions 13a.

As illustrated in FIGS. 4Ba and 4Bb, the resist film 71 is removed by an ashing process with $O_2$ plasma, or the like.

Figure 5A:
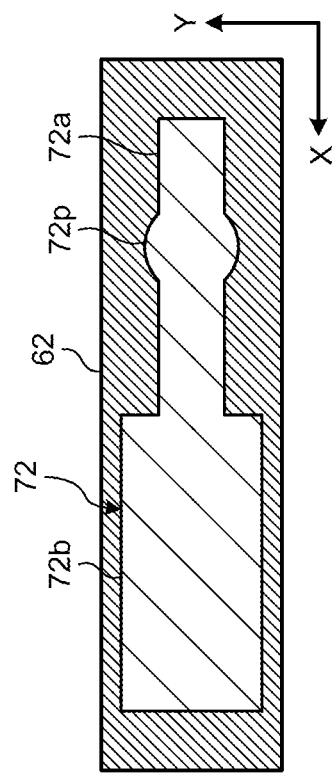
FIGS. 5Aa to 5Bb are diagrams illustrating an example of procedures in the manufacturing method of the template according to the embodiment.

As illustrated in FIGS. 5Aa and 5Ab, a hard mask film 62 is newly formed on the entire surface of the substrate 11. The hard mask 62 may be made of the same material as the hard mask 61 or may be made of a different material from the hard mask 61. When the material of the hard mask 62 is different from that of the hard mask 61, it is desirable for the material to cause the etching rate of the hard mask 62 to be equal to or higher than the etching rate of the hard mask 61. At this time, the hard mask film 62 is also formed on the patterns 61p of the hard mask film 61, and becomes patterns 62p that substantially conform in shape with the patterns 61p when seen in the top view.

Figure 5B:
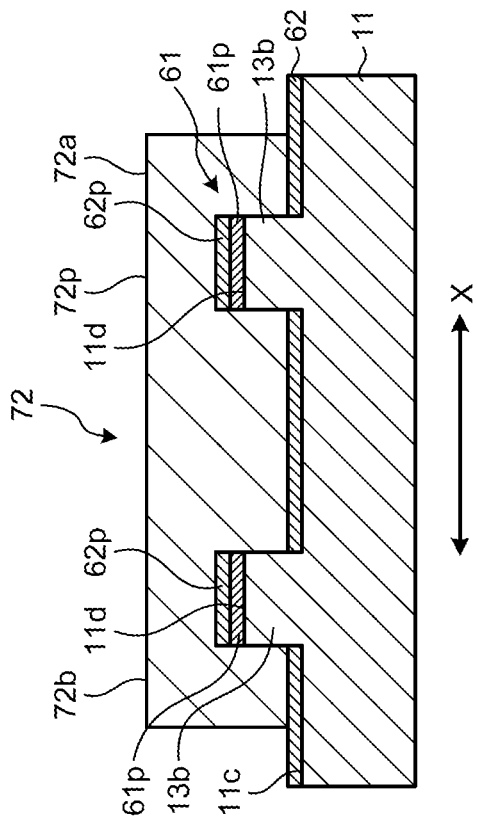
Figure 5A:
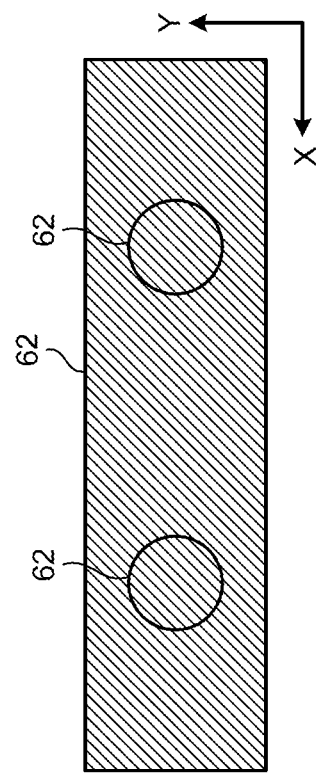
Figure 5B:
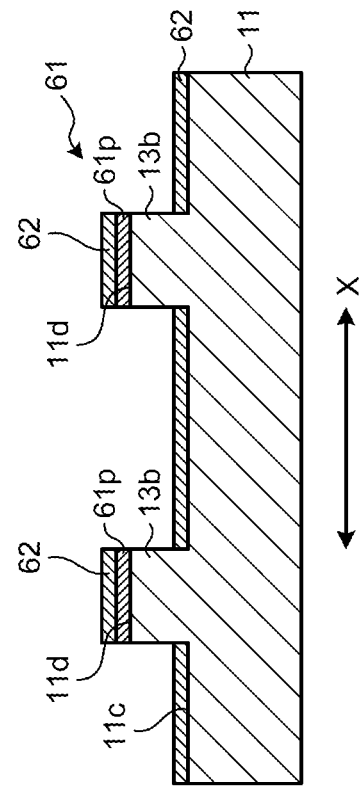

As illustrated in FIGS. 5Ba and 5Bb, a resist film 72 for EB drawing is newly formed on the entire surface of the substrate 11. Then, patterns 72a, 72b, and 72p are formed on the resist film 72 by EB drawing, for example.

The patterns 72a are patterns for forming the projecting portions 12a on the substrate 11. The patterns 72a extend on the hard mask film 62 in the X-direction, for example, and are formed at positions overlapping with some of the plurality of columnar portions 13b to be the columnar portions 13a later. The patterns 72b are patterns for forming the projecting portions 12b on the substrate 11. The patterns 72b extend on the hard mask film 62 in the X-direction, for example, and are formed at positions overlapping with the columnar portions 13b other than the above. The width in the Y-direction of each pattern 72b is wider than the width in the Y-direction of each pattern 72a. The patterns 72p are patterns for protecting the columnar portions 13b and the patterns 61p and 62p of the hard mask films 61 and 62, and thus are formed at positions substantially corresponding thereto.

As illustrated in FIGS. 6Aa and 6Ab, the patterns 72a, 72b, and 72p of the resist film 72 are transferred onto the hard mask film 62, and patterns 62a, 62b, and 62p are thereby formed.

As illustrated in FIGS. 6Ba and 6Bb, while being partially protected by the resist film 72 and the hard mask film 62, the surface 11c of the substrate 11 is removed to a predetermined depth in the thickness direction of the substrate 11, and a surface 11a is thereby exposed as a third surface of the substrate 11. Since the surface 11c of the substrate 11 is removed to a predetermined depth, the substrate 11 becomes further thinner, and the surface 11a becomes a new main face of the substrate 11.

Further, at this time, projecting portions 12a are formed each having a top surface derived from the surface 11c of the substrate 11, and projecting portions 12b are formed each having a top surface derived from the surface 11c of the substrate 11 and a width in the Y-direction wider than that of each projecting portion 12a. However, at this time, each projecting portion 12a still has a top surface height substantially the same as that of each projecting portion 12b.

Figure 7A:
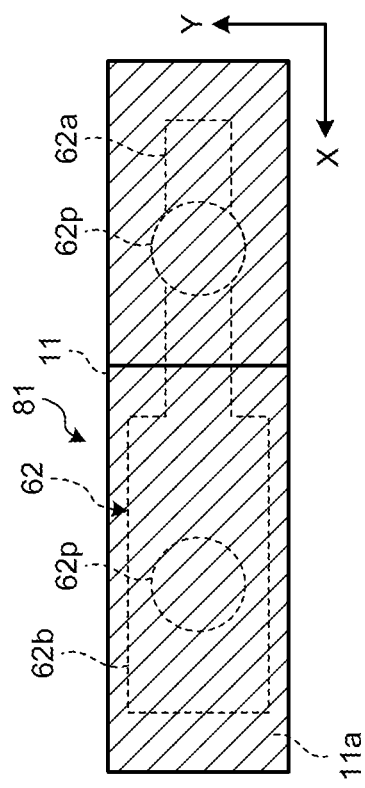
FIGS. 7Aa to 7Bb are diagrams illustrating an example of procedures in the manufacturing method of the template according to the embodiment.
Figure 7A:
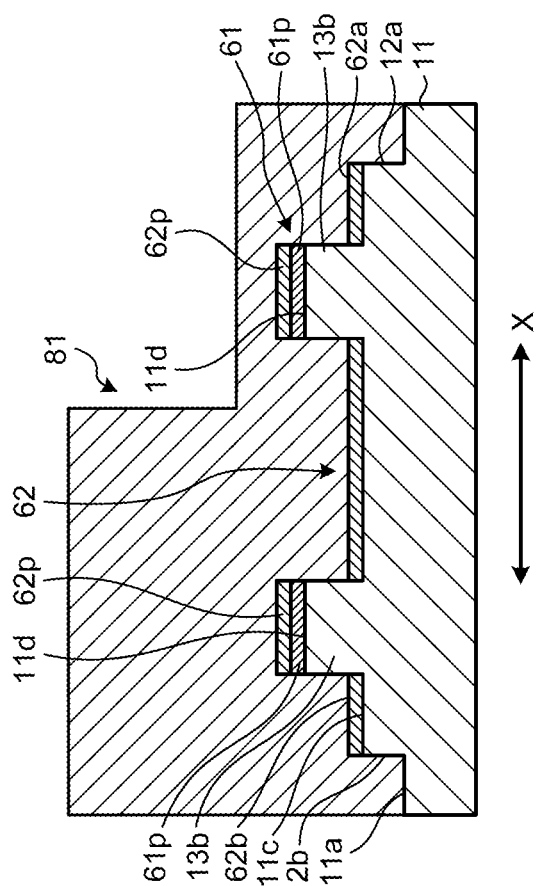

As illustrated in FIGS. 7Aa and 7Ab, the resist film 72 is removed by an ashing process with $O_2$ plasma, or the like.

Figure 7B:
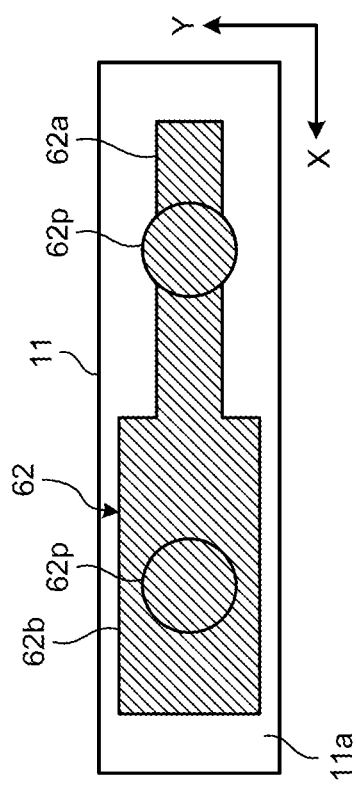
Figure 7B:
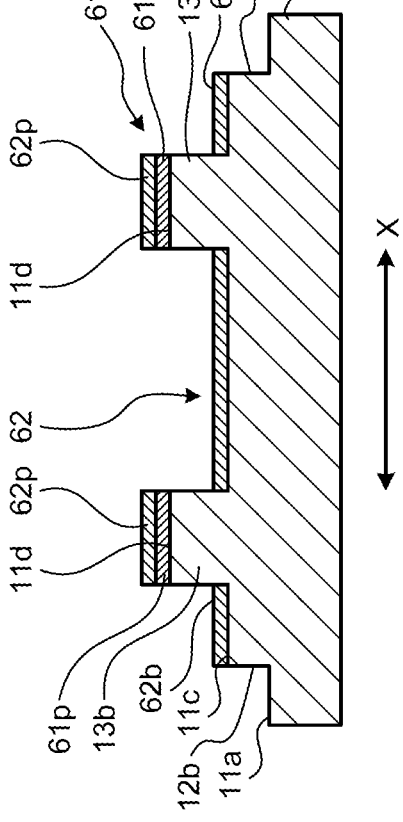

As illustrated in FIGS. 7Ba and 7Bb, a cover resist film 81 is newly formed on the entire surface of the substrate 11. The cover resist film 81 has a different film thickness depending on the place on the substrate 11. Specifically, the cover resist film 81 is formed thinner at places including the projecting portions 12a, and is formed thicker at places including the projecting portions 12b.

However, in the region AR where a projecting portion 12a and a projecting portion 12b are connected to each other, the cover resist film 81 is formed thicker also at a partial place of the projecting portion 12a adjacent to the projecting portion 12b. Alternatively, in the region AR where a projecting portion 12a and a projecting portion 12b are connected to each other, the cover resist film 81 may be formed thinner at a partial place of the projecting portion 12b adjacent to the projecting portion 12a, contrary to the above.

The cover resist film 81 having difference film thicknesses as described above may be formed by an imprint technique, for example. Specifically, a template is used which includes shallow recesses at places corresponding to the projecting portions 12a and deep recesses at places corresponding to the projecting portions 12b. The patterns of these recesses of the template are transferred onto the cover resist film 81, and the cover resist film 81 is thereby formed having difference film thicknesses at respective places. In this case, for example, a photo-curing resist material for imprint may be used for the cover resist film 81.

The mismatching between the film thickness boundary of the cover resist film 81 described above and the junction between the projecting portions 12a and 12b can be caused, for example, by dimensional deviation of the template for forming the cover resist film 81, and/or positioning misalignment between the projecting portions 12a and 12b and so forth already formed on the substrate 11 and the patterns of the template.

Figure 8A:
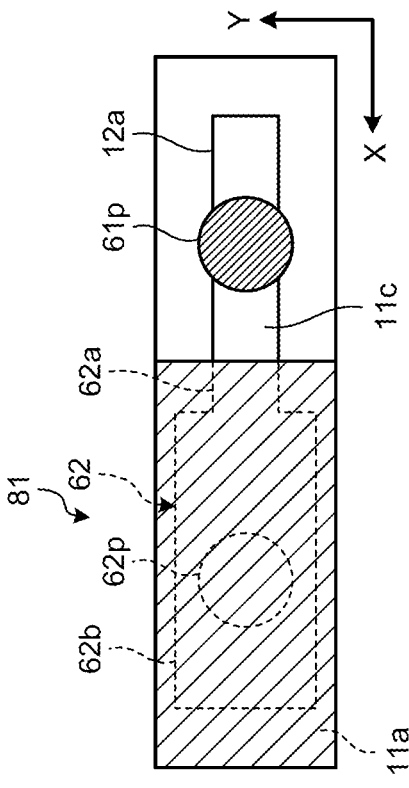
FIGS. 8Aa to 8Bb are diagrams illustrating an example of procedures in the manufacturing method of the template according to the embodiment.
Figure 8A:
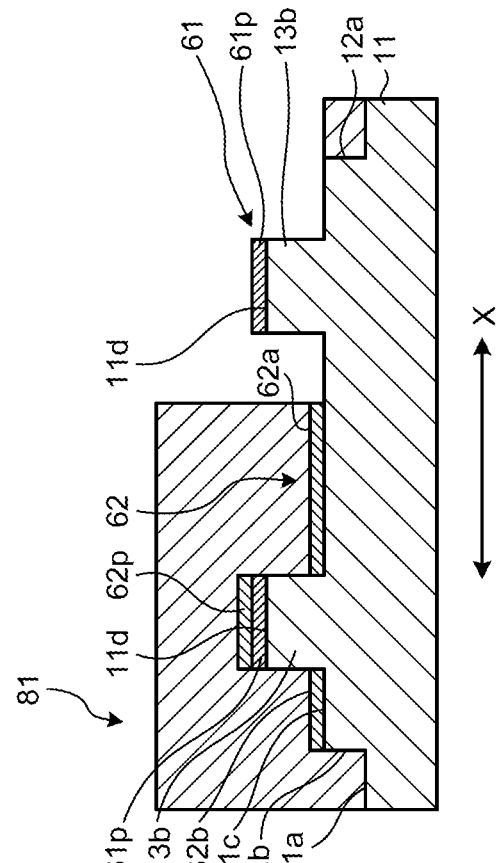

As illustrated in FIGS. 8Aa and 8Ab, the cover resist film 81 is etched back over the entire surface, such that, of the hard mask film 62, the patterns 62a on the projecting portions 12a and the patterns 62p on the columnar portions 13b arranged on the projecting portions 12a are exposed.

At this time, at places including the projecting portions 12b, since the cover resist film 81 is originally thicker, the projecting portions 12b and the columnar portions 13b arranged on the projecting portions 12b, including the patterns 62b and 62p of the hard mask film 62, remain covered by the cover resist film 81 without being exposed.

Further, since the cover resist film 81 is formed thicker also at the partial place of the projecting portion 12a adjacent to the projecting portion 12b, the corresponding partial place of the pattern 62a on the projecting portion 12a adjacent the projecting portion 12b also remains covered by the cover resist film 81.

Alternatively, as described above, when the cover resist film 81 is formed thinner at the partial place of the projecting portion 12b adjacent to the projecting portion 12a, the corresponding partial place of the pattern 62b on the projecting portion 12b adjacent the projecting portion 12a comes to be exposed, contrary to the above.

Figure 8B:
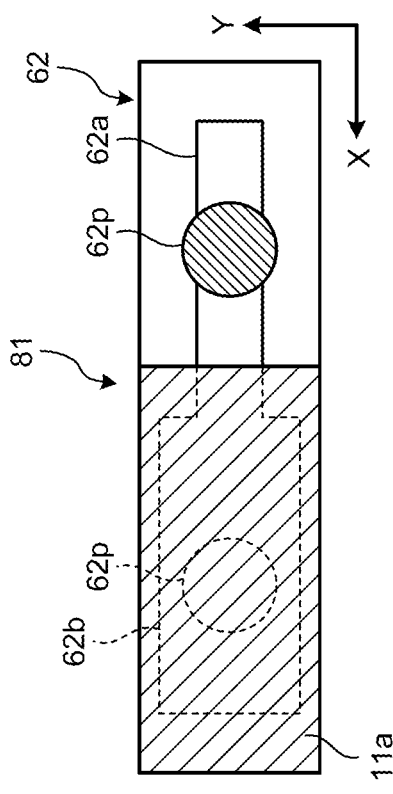
Figure 8B:
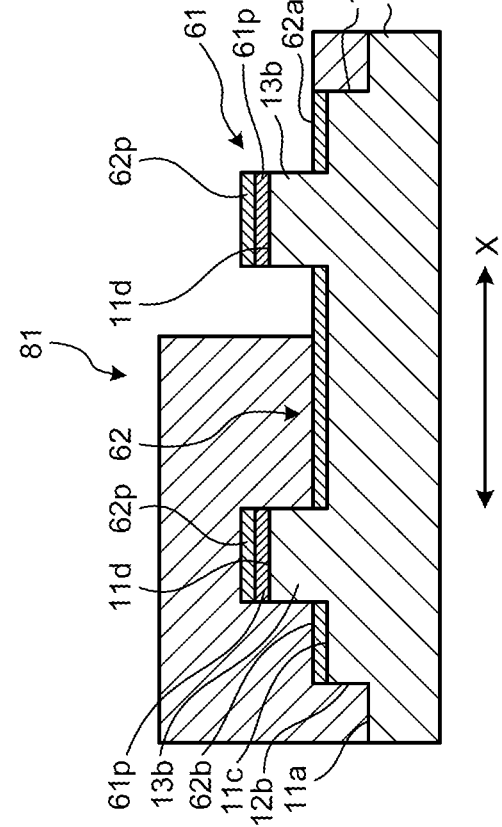

As illustrated in FIGS. 8Ba and 8Bb, those parts of the patterns 62a and 62p of the hard mask film 62 exposed from cover resist film 81 are removed. Consequently, the top surfaces of the projecting portions 12a are exposed, and the patterns 61p on the columnar portions 13b arranged on the projecting portions 12a are exposed. The patterns 61p on the columnar portions 13b function as a mask to protect the columnar portions 13b in the processing of the substrate 11 to be subsequently performed. Therefore, when the removal of the patterns 62p on the patterns 61p is performed, the etching time is adjusted to cause the patterns 61p to be left with a sufficient film thickness. When the hard mask 62 is made of a material that can be higher in etching rate than the hard mask 61, the removal of the patterns 62p may be performed while a selection ratio is set between the patterns 61p and 62p.

As illustrated in FIGS. 9Aa and 9Ab, the surface 11c of the substrate 11, which corresponds to the top surfaces of the projecting portions 12a exposed by the removal of the patterns 62a of the hard mask film 62, is removed to a predetermined depth in the thickness direction of the substrate 11, and a surface 11b is thereby exposed as a fourth surface of the substrate 11. Consequently, projecting portions 12a are formed each having a top surface derived from the surface 11b of the substrate 11 higher than the surface 11a of the substrate 11 and lower than the surface 11c of the substrate 11.

At this time, the surface 11d of the substrate 11, which corresponds to the top surfaces of the columnar portions 13b arranged on the projecting portions 12a, is protected by the patterns 61p of the hard mask film 61, and is thereby maintained at the same height. Consequently, columnar portions 13a are formed while keeping the height from the surface 11a of the substrate 11.

Further, at this time, below the partial place of the pattern 62a of the hard mask film 62, which has been left without being removed because of the protection of the thicker cover resist film 81, a connecting portion 12j is formed having a top surface derived from the surface 11c of the substrate 11 and a width in the Y-direction narrower than that of the projecting portion 12b. However, as described above, when the cover resist film 81 is formed thinner at the partial place of the projecting portion 12b adjacent to the projecting portion 12a, a connecting portion 12j is formed having a top surface derived from the surface 11b of the substrate 11 and a width in the Y-direction substantially equal to that of the projecting portion 12b, on the contrary.

As illustrated in FIGS. 9Ba and 9Bb, the cover resist film 81 is removed by an ashing process with $O_2$ plasma, or the like.

Thereafter, the remaining hard mask films 61 and 62 are removed. Consequently, on the surface 11a of the substrate 11, projecting portions 12a are formed each having a top surface derived from the surface 11b of the substrate 11, and projecting portions 12b are formed each having a top surface derived from the surface 11c of the substrate 11. Further, on the surface 11a of the substrate 11, columnar portions 13a are formed each having a top surface derived from the surface 11d of the substrate 11 and are arranged at positions overlapping with the projecting portions 12a, and columnar portions 13b are formed each having a top surface derived from the surface 11d of the substrate 11 and are arranged at positions overlapping with the projecting portions 12b.

As a result, the template 10 according to the embodiment is manufactured.

(Manufacturing Method of Semiconductor Device)

Next, with reference to FIGS. 10Aa to 12, an explanation will be given of a method of forming the dual damascene pattern 54 on the semiconductor device 20 according to the embodiment. The formation of the dual damascene pattern 54 on the semiconductor device 20 is performed as part of a manufacturing method of the semiconductor device 20 according to the embodiment.

Figure 10A:
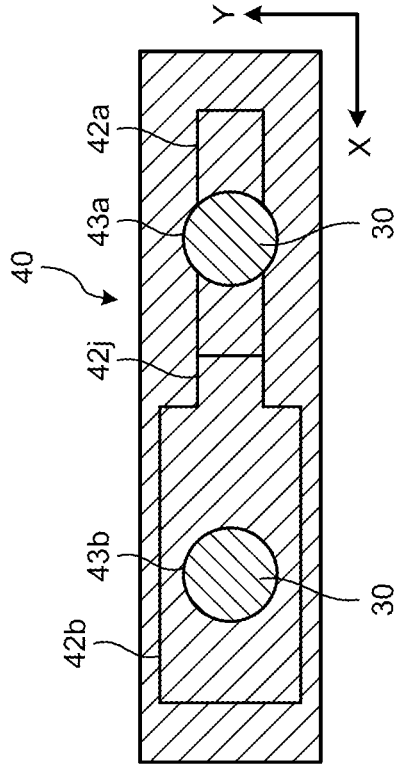
FIGS. 10Aa to 10Bb are diagrams illustrating an example of procedures in a manufacturing method of a semiconductor device according to the embodiment.
Figure 10A:
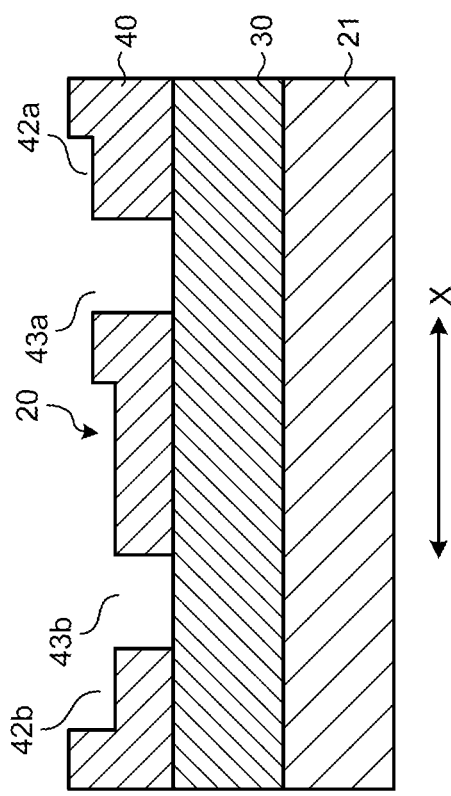

FIGS. 10Aa to 11Bb are diagrams illustrating an example of procedures in a manufacturing method of the semiconductor device 20 according to the embodiment. The symbols "A" and "B" in the drawing numbers of FIGS. 10Aa to 11Bb indicate that the processing progresses sequentially in this order. Each figure with a drawing number including "a" attached to "A" or "B" of FIGS. 10Aa to 11Bb is a plan view illustrating a region of the semiconductor device 20 corresponding to the region AR of the template 10 in the associated processing step. Each figure with a drawing number including "b" attached to "A" or "B" of FIGS. 10Aa to 11Bb is a sectional view illustrating the region of the semiconductor device 20 corresponding to the region AR of the template 10 in the associated processing step.

As illustrated FIGS. 10Aa and 10Ab, the semiconductor device 20 in the manufacturing process includes a processing object film 21, which is a target for forming the dual damascene pattern 54. For example, the processing object film 21 is an insulating film made of $SiO_2$, SiN, SiON, or the like.

Below the processing object film 21, structures (not illustrated), such as lower layer interconnection lines, have already been formed. A carbon film 30 has been formed on the processing object film 21, and a resist film 40 as a first film has been formed on the carbon film 30. For example, the resist film 40 is a photo-curing resist film for imprint.

The template 10 described above is set in position such that the surface 11a with the transferring pattern 14 formed thereon is opposed to this resist film 40. Then, the transferring pattern 14 of the template 10 is pressed against the resist film 40, and, in that state, the resist film 40 is irradiated with light, such as ultraviolet rays, to cure the resist film 40. Thereafter, the transferring pattern 14 of the template 10 is separated from the resist film 40. In this way, the transferring pattern 14 of the template 10 is transferred onto the resist film 40.

Specifically, as the projecting portions 12a and 12b of the template 10 are transferred, trench patterns 42a and 42b are formed on the resist film 40, such that the trench patterns 42b are deeper in bottom depth and wider in width in the Y-direction than the trench patterns 42a. Further, as the columnar portions 13a and 13b of the template 10 are transferred, hole patterns 43a and 43b are formed on the resist film 40, such that the hole patterns 43a are arranged at positions overlapping with the trench patterns 42a, and the hole patterns 43b are arranged at positions overlapping with the trench patterns 42b and are the same in bottom depth as the hole patterns 43a. Further, as the connecting portion 12j of the template 10 is transferred, a connecting pattern 42j is formed at the junction between trench patterns 42a and 42b on the resist film 40.

Here, when the pressing of the template 10 against the resist film 40 is performed, such a distance is kept that prevents the transferring pattern 14 of the template 10 from penetrating the resist film 40, and thereby prevents the template 10 from coming into contact with the processing object film 21 or the like of the semiconductor device 20. Accordingly, a resist residual film RLT is left at the bottom of each of the hole patterns 43a and 43b where the tallest columnar portions 13a and 13b of the transferring pattern 14 have been transferred onto the resist film 40.

Figure 10B:
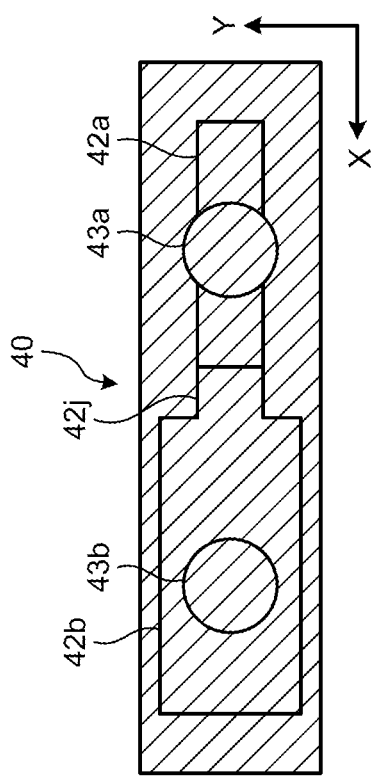
Figure 10B:
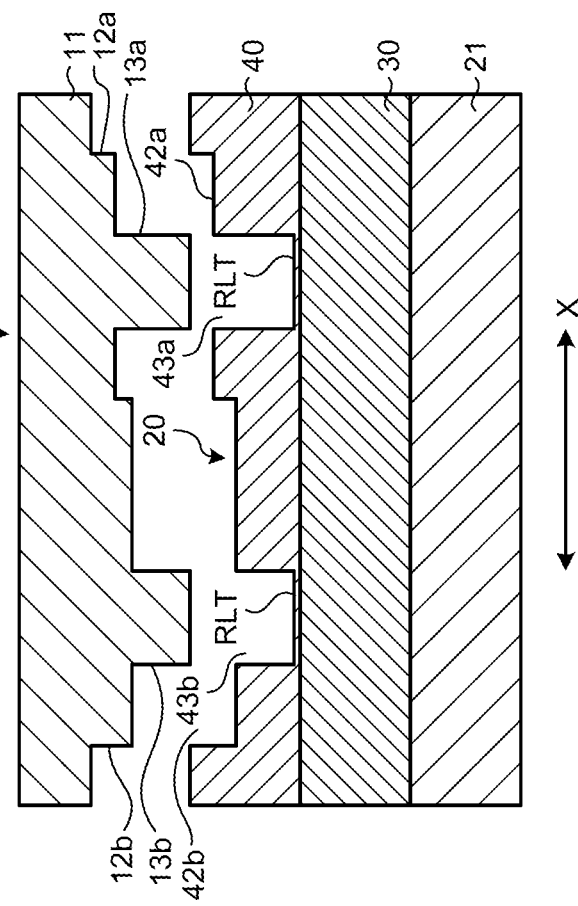

As illustrated in FIGS. 10Ba and 10Bb, the resist film 40 is etched back over the entire surface, such that the resist residual film RLT at the bottom of each of the hole patterns 43a and 43b is removed.

Figure 11A:
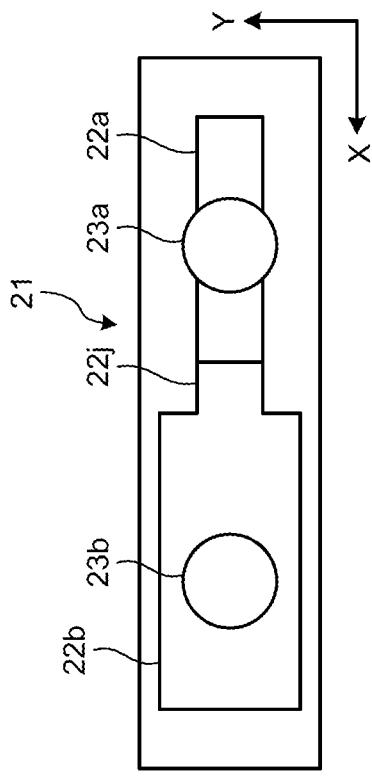
FIGS. 11Aa to 11Bb are diagrams illustrating an example of procedures in the manufacturing method of the semiconductor device according to the embodiment.
Figure 11A:
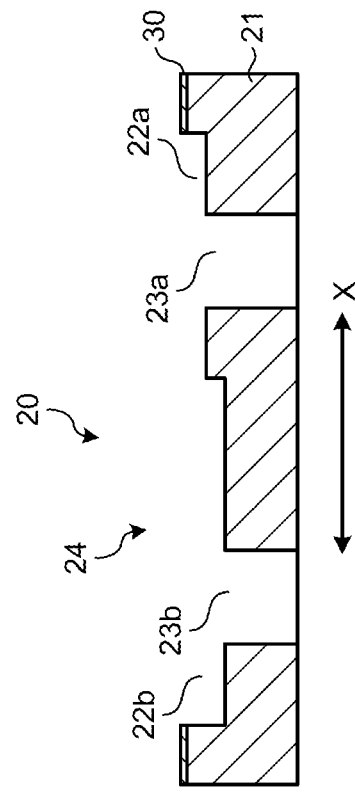

As illustrated in FIGS. 11Aa and 11Ab, the trench patterns 42a and 42b, the hole patterns 43a and 43b, and the connecting pattern 42j of the resist film 40 are transferred to the carbon film 30 on the lower side, and trench patterns 32a and 32b, hole patterns 33a and 33b, and a connecting pattern 32j are thereby formed on the carbon film 30. At this time, the resist film 40 substantially disappears.

Figure 11B:
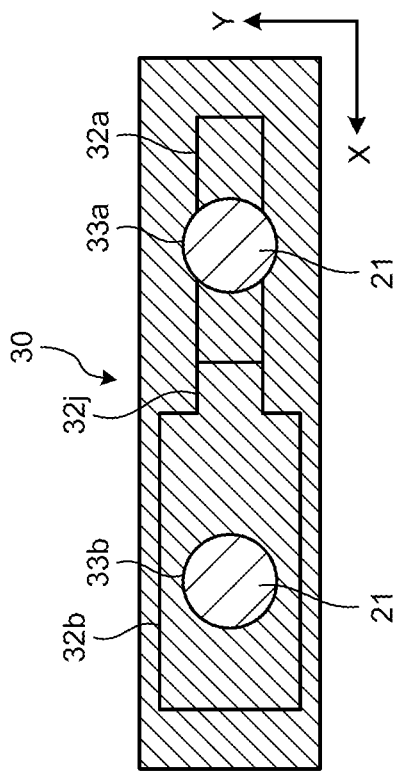
Figure 11B:
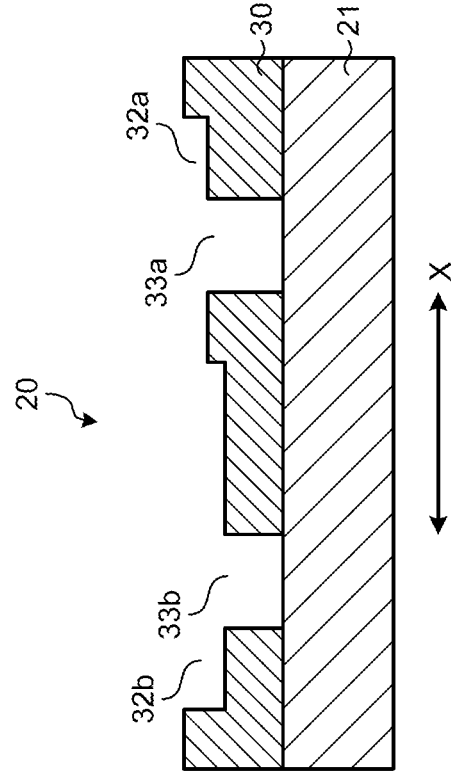

As illustrated in FIGS. 11Ba and 11Bb, the trench patterns 32a and 32b, the hole patterns 33a and 33b, and the connecting pattern 32j of the carbon film 30 are transferred to the processing object film 21 on the lower side, and a pattern 24 is thereby formed on the processing object film 21, such that the pattern 24 includes trenches 22a and 22b as first and second trenches, holes 23a and 23b as first and second holes, and a connecting portion 22j. Consequently, the holes 23a and 23b penetrate the processing object film 21 and reach lower layer interconnection lines or the like (not illustrated) on the lower side.

Thereafter, the remaining carbon film 30 is removed by an asking process with $O_2$ plasma, or the like. Further, a conductive material that is a simple substance or alloy of any metal, such as Cu, Ru, Co, or W, is filled into the pattern 24 of the processing object film 21. Further, a barrier metal layer made of TIN or the like may be formed prior to the filling of the conductive material, to make the pattern 24 filled with a plurality of layers. The trenches 22a and 22b of the pattern 24 are filled with the conductive material, and thereby become interconnection lines. The holes 23a and 23b are filled with conductive the material, and thereby become vias that connect the interconnection lines described above to lower layer interconnection lines (not illustrated).

Figure 12:
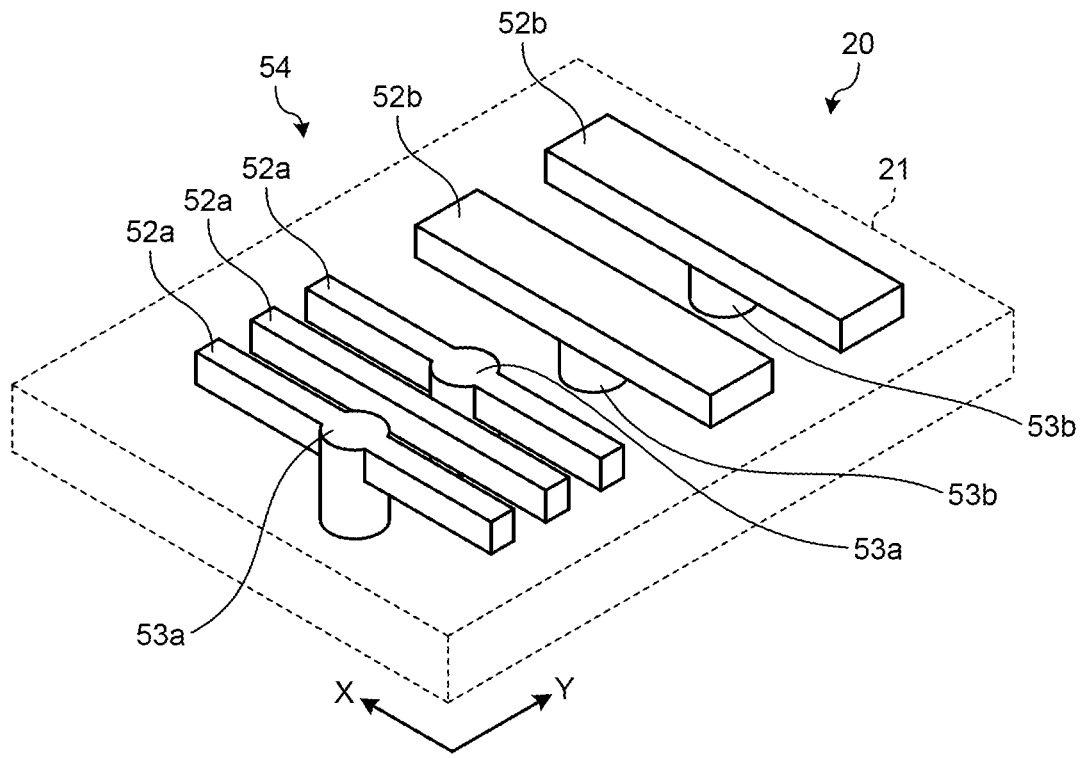
FIG. 12 is a see-through perspective view illustrating a dual damascene pattern provided in a semiconductor device according to the embodiment.

As a result, the dual damascene pattern 54 illustrated in FIG. 12 is formed on the processing object film 21.

FIG. 12 is a see-through perspective view illustrating the dual damascene pattern 54 provided in the semiconductor device 20 according to the embodiment. More specifically, FIG. 12 illustrates the dual damascene pattern 54 of the semiconductor device 20 in a state obtained by looking down and seeing through the processing object film 21 from above the processing object film 21. Also in FIG. 12, for the sake of convenience, the X-direction and the Y-direction consistent with FIGS. 2A to 2C described above are defined.

As illustrated in FIG. 12, the dual damascene pattern 54 has been formed on the processing object film 21 of the semiconductor layer 20. The dual damascene pattern 54 includes a plurality of interconnection lines 52a and 52b and a plurality of vias 53a and 53b.

The plurality of interconnection lines 52a are arrayed in the Y-direction and extend in the X-direction. Here, some of the plurality of interconnection lines 52a may extend in a direction other than the X-direction, such as the Y-direction.

The plurality of interconnection lines 52b are arrayed in the Y-direction and extend in the X-direction. The bottom depth of each interconnection line 52b as a second depth from the top surface of the processing object film 21, i.e., the thickness of each interconnection line 52b, is larger than the bottom depth of each interconnection line 52a as a first depth, i.e., the thickness of each interconnection line 52a. Further, the width in the Y-direction of each interconnection line 52b as a second width is wider than the width in the Y-direction of each interconnection line 52a as a first width. Here, some of the plurality of interconnection lines 52b may extend in a direction other than the X-direction, such as the Y-direction.

Further, some of the interconnection lines 52b may be connected to some of the interconnection lines 52a. In this case, an interconnection line 52a and an interconnection line 52b are connected to each other through a connecting portion in which the connecting portion 22j is filled with the conductive material.

The thickness of the connecting portion is substantially equal to the thickness of each interconnection line 52b. The width in the Y-direction of the connecting portion is substantially equal to the width in the Y-direction of each interconnection line 52a. However, the connecting portion may be configured such that the thickness of the connecting portion is substantially equal to the thickness of each interconnection line 52a, and the width in the Y-direction of the connecting portion is substantially equal to the width in the Y-direction of each interconnection line 52b.

The plurality of vias 53a are arranged at positions overlapping with the respective interconnection lines 52a. Each of the vias 53a has a substantially flat bottom surface that is deeper than the reaching depths of the interconnection lines 52a and 52b. The cross section of each via 53a orthogonal to the depth direction is circular, elliptical, or oval, for example. The diameter in the Y-direction of each via 53a is larger than the width in the Y-direction of each interconnection line 52a and smaller than the width in the Y-direction of each interconnection line 52b. Therefore, the upper end of each via 53a is arranged sticking out from the width in the Y-direction of the associated interconnection line 52a to divide this interconnection line 52a.

The plurality of vias 53b are arranged at positions overlapping with the respective interconnection lines 52b. Each of the vias 53b has a substantially flat bottom surface that is deeper than the reaching depths of the interconnection lines 52a and 52b. The bottom depth of each via 53b as a third depth from the top surface of the processing object film 21 is substantially equal to the bottom depth of each via 53a as the third depth from the top surface of the processing object film 21. The cross section of each via 53b orthogonal to the depth direction has a shape same as that of the cross section of each via 53a. The width (diameter) in the Y-direction of each via 53b is substantially equal to the width (diameter) in the Y-direction of each via 53a. The area of the cross section of each via 53b orthogonal to the depth direction is substantially equal to the area of the cross section of each via 53a. Therefore, each via 53b is arranged falling within the width in the Y-direction of the lower surface of the associated interconnection line 52b.

The bottom surfaces of the plurality of vias 53a and 53b are connected to lower layer interconnection lines or the like (not illustrated) on the lower side of the processing object film 21. Thus, the plurality of vias 53a and 53b electrically connect the lower layer interconnection lines (not illustrated) to the interconnection lines 52a and 52b.

(Overview)

In a process of manufacturing a semiconductor device, there is a case where a dual damascene method is used that collectively forms vias for connecting upper layer interconnection lines to lower layer interconnection lines, and the upper layer interconnection lines. As the miniaturization of semiconductor devices progresses, the need is increasing to form a dual damascene pattern including such upper layer interconnection lines and vias by an imprint technique.

Further, there is a case where a dual damascene pattern contains a plurality of types of interconnection lines different in line width. In this case, it is considered that an interconnection line with a larger line width is intended to suppress the density of current flowing through the interconnection line.

The present inventors have made the following considerations. In the formation of a dual damascene pattern using the conventional photolithography technique, interconnection lines to be arranged in the same layer can be formed only with the same thickness. For this reason, a design is inevitably adopted that reduces the current density by simply making the line widths of interconnection lines different.

In other words, the present inventors have though that there may be a potential design requirement to increase the line width of an interconnection line together with its thickness to increase the cross sectional area of the interconnection line in order to reduce the current density.

As a result of assiduous research, the present inventors have arrived at construction of a template and template manufacturing method that can form interconnection lines different in line width and thickness, and vias with uniform bottom depth.

The template 10 according to the embodiment is provided with the transferring pattern 14 that includes the projecting portions 12a, the projecting portions 12b larger in thickness and larger in width in the Y-direction than the projecting portions 12a, the columnar portions 13a arranged at positions overlapping with the projecting portions 12a, and the columnar portions 13b arranged at positions overlapping with the projecting portions 12b and substantially equal to the columnar portions 13a in top surface height from the surface 11a of the substrate 11. Consequently, it is possible to address desired values of the via size and the upper layer interconnection line size.

The manufacturing method of the template 10 according to the embodiment includes forming the columnar portions 13b each having a top surface derived from the surface 11d of the substrate 11, forming the projecting portions 12a and 12b each having a top surface derived from the surface 11c of the substrate 11, at positions overlapping with the columnar portions 13b, and exposing the surface 11b of the substrate 11 at the top surfaces of the projecting portions 12a. Consequently, it is possible to manufacture the template 10 that can address desired values of the via size and the upper layer interconnection line size.

The manufacturing method of the semiconductor device 20 according to the embodiment includes transferring the transferring pattern 14 of the template 10 onto the resist film 40, and then transferring the trench patterns 42a and 42b and the hole pattern 43a and 43b of the resist film 40 onto the processing object film 21 and thereby forming, on the processing object film 21, the pattern 24 that includes the trenches 22a and 22b and the holes 23a and 23b. Consequently, it is possible to form the dual damascene pattern 54 with desired values of the via size and the upper layer interconnection line size.

(Modification)

In the embodiment described above, in order to form the dual damascene pattern 54 including the interconnection lines 52a and 52b different in line width and thickness, it is adopted to form the projecting portions 12a and 12b different in line width and thickness on the template 10. However, it may be adopted to form projecting portions equal in line width and different in thickness on a template, so as to form a dual damascene pattern including interconnection lines equal in line width and different in thickness.

Figure 13:
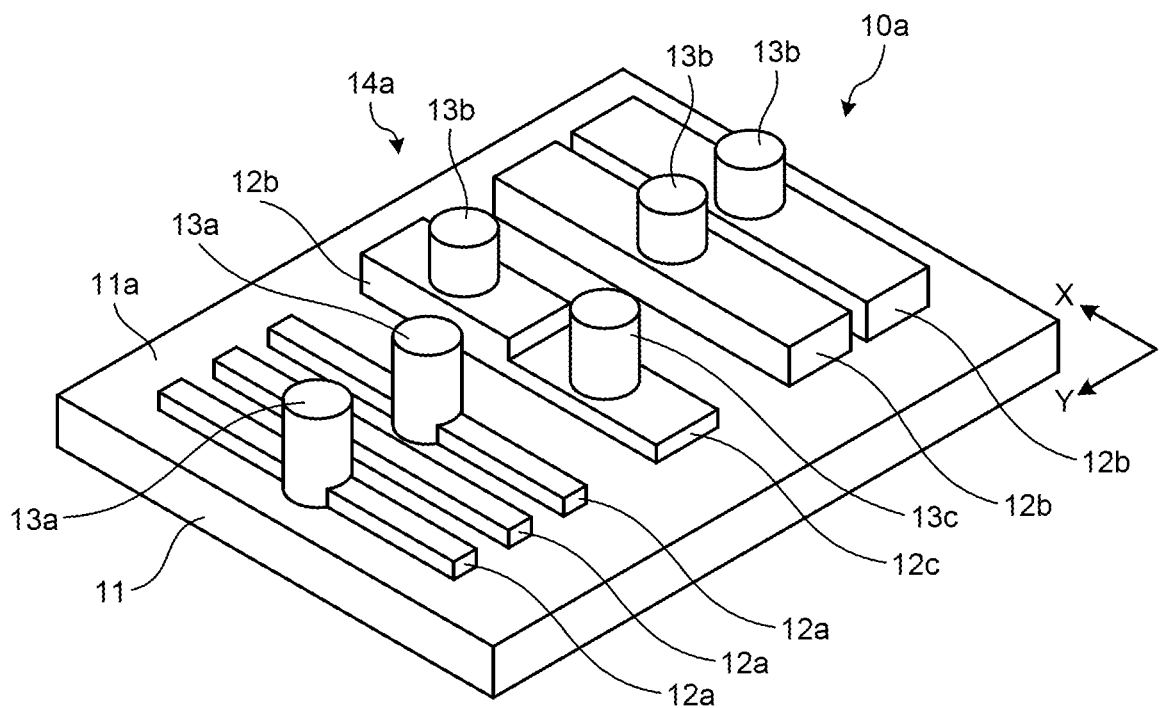
FIG. 13 is a perspective view illustrating an example of the configuration of a template according to a modification of the embodiment.

FIG. 13 is a perspective view illustrating an example of the configuration of a template 10a according to a modification of the embodiment.

As illustrated in FIG. 13, the template 10a according to the modification is provided with a transferring pattern 14a that includes a projecting portion 12c and a columnar portion 13c, in addition to projecting portions 12a and 12b and columnar portions 13a and 13b configured as in the template 10 according to the embodiment described above.

The projecting portion 12c is arrayed in the Y-direction with respect to the other projecting portions 12a and 12b and extends in the X-direction. The projecting portion 12c has a substantially flat top surface and lateral surfaces arranged on both sides in the Y-direction of the top surface. The top surface height of the projecting portion 12c from the surface 11a of the substrate 11 is substantially equal to the top surface height of each projecting portion 12a from the surface 11a of the substrate 11. The width in the Y-direction of the projecting portion 12c is substantially equal to the width in the Y-direction of each projecting portion 12b. Here, the projecting portion 12c may extend in a direction other than the X-direction, such as the Y-direction. Further, the projecting portion 12c may be connected to a projecting portion 12b or the like, for example.

The columnar portion 13c is arranged at a position overlapping with the projecting portion 12c, and has a substantially flat top surface higher than the top surfaces of the projecting portions 12a, 12b, and 12c. The top surface height of the columnar portion 13c from the surface 11a of the substrate 11 is substantially equal to the top surface height of each of the columnar portions 13a and 13b from the surface 11a of the substrate 11. The cross section of the columnar portion 13c orthogonal to the height direction has a shape the same as that of the cross section of each of the columnar portions 13a and 13b. The diameter of the columnar portion 13c is substantially equal to the diameter of each of the columnar portions 13a and 13b. Therefore, the columnar portion 13c is arranged falling within the width in the Y-direction of the top surface of the projecting portion 12c.

For example, such a template 10a may be manufactured by a manufacturing method substantially the same as that for the template 10 according to the embodiment described above. However, the junction between the projecting portions 12b and 12c is not provided with the connecting portion 12j described above or a structure similar thereto.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising a transferring pattern on a first surface of a substrate,
   the transferring pattern including:
   a first projecting portion that projects from the first surface with a first height and extends along the first surface;
   a second projecting portion that projects from the first surface with a second height higher than the first height and extends along the first surface;
   a first columnar portion that is arranged at a position overlapping with the first projecting portion and has a top surface with a third height higher than the second height, the third height being a height from the first surface; and
   a second columnar portion that is arranged at a position overlapping with the second projecting portion and has a top surface with the third height,
   wherein a first width of the first projecting portion in a first direction along the first surface and intersecting with an extending direction of the first projecting portion is narrower than a second width of the second projecting portion in a second direction along the first surface and intersecting with an extending direction of the second projecting portion.

2. The template according to claim 1, wherein
   a width of the first columnar portion in the first direction is larger than the first width, and
   a width of the second columnar portion in the second direction is smaller than the second width.

3. The template according to claim 1, wherein an area of a cross section of the first columnar portion orthogonal to a height direction thereof is substantially equal to an area of a cross section of the second columnar portion orthogonal to a height direction thereof.

4. The template according to claim 1, wherein one end of the first projecting portion in the extending direction thereof is connected to one end of the second projecting portion in the extending direction thereof by a connecting portion.

5. The template according to claim 4, wherein
   a width of the first columnar portion in the first direction is larger than the first width, and
   a width of the second columnar portion in the second direction is smaller than the second width.

6. The template according to claim 4, wherein an area of a cross section of the first columnar portion orthogonal to a height direction thereof is substantially equal to an area of a cross section of the second columnar portion orthogonal to a height direction thereof.

7. The template according to claim 4, wherein
   a height of a top surface of the connecting portion from the first surface is the second height, and
   a width of the connecting portion in the first direction is the first width.

8. The template according to claim 1, wherein
   the extending directions of the first and second projecting portions are respectively the longest dimensions of the first and second projecting portions.

9. The template according to claim 8, wherein
   the extending direction of the first projecting portion and the extending direction of the second projecting portion are same.

10. The template according to claim 8, wherein
    the extending direction of the first projecting portion and the extending direction of the second projecting portion are different.

* * * * *

UNITED STATES PATENT AND TRADEMARK OFFICE
CERTIFICATE OF CORRECTION

PATENT NO. : 11,806,901 B2
APPLICATION NO. : 17/199967
DATED : November 7, 2023
INVENTOR(S) : Takahata et al.

Page 1 of 1

It is certified that error appears in the above-identified patent and that said Letters Patent is hereby corrected as shown below:

In the Claims

Claim 9, Column 14, Line 54, "are same" should read --are the same--.

Signed and Sealed this
Thirtieth Day of January, 2024

Katherine Kelly Vidal
*Director of the United States Patent and Trademark Office*